United States Patent [19]
Rostoker

[11] Patent Number: 5,399,898
[45] Date of Patent: Mar. 21, 1995

[54] MULTI-CHIP SEMICONDUCTOR ARRANGEMENTS USING FLIP CHIP DIES

[75] Inventor: Michael D. Rostoker, San Jose, Calif.

[73] Assignee: LSI Logic Corporation, Milpitas, Calif.

[21] Appl. No.: 975,185

[22] Filed: Nov. 12, 1992

Related U.S. Application Data

[63] Continuation-in-part of Ser. No. 916,328, Jul. 17, 1992, Pat. No. 5,340,772, and a continuation-in-part of Ser. No. 935,449, Aug. 25, 1992, Pat. No. 5,300,813.

[51] Int. Cl.⁶ .................. H05K 1/14; H01L 23/52; H01L 23/54
[52] U.S. Cl. .................. 257/499; 257/777; 257/778; 257/723; 257/724
[58] Field of Search .............. 257/777, 778, 723, 724, 257/685, 686, 499

[56] References Cited

U.S. PATENT DOCUMENTS

| | | | |
|---|---|---|---|
| 4,807,021 | 2/1989 | Okumura | 257/738 |
| 4,897,708 | 1/1990 | Clements | 357/65 |
| 4,982,265 | 6/1991 | Watanabe et al. | 257/737 |
| 5,191,405 | 3/1993 | Tomita et al. | 257/777 |
| 5,220,200 | 9/1993 | Blanton | 257/780 |
| 5,239,448 | 8/1993 | Perkins et al. | 257/686 |

FOREIGN PATENT DOCUMENTS

| | | | |
|---|---|---|---|
| 0314437A1 | 5/1989 | European Pat. Off. | 257/737 |
| 3233195A1 | 3/1983 | Germany | 257/737 |

*Primary Examiner*—William L. Sikes
*Assistant Examiner*—Fetsum Abraham
*Attorney, Agent, or Firm*—Hongiman Miller Schwartz and Cohn

[57] ABSTRACT

Multi-chip, multi-tier semiconductor arrangements based upon single and double-sided flip-chips are described. The double-sided flip chips provide raised bump contact means on both major surfaces of a die and provided connections to internal signals within the die, feed through connections between contacts on opposite sides of the die, and jumpered connections between contacts on the same side of the die. Various multi-chip configurations are described. Certain of these flip-chip configuration dramatically increase the ratio of I/O area (periphery) to footprint area, permitting larger numbers of I/O points within a given assembly footprint than would otherwise be possible in a single die configuration.

8 Claims, 10 Drawing Sheets

MULTI-CHIP SEMICONDUCTOR ARRANGEMENTS USING FLIP CHIP DIES

CROSS-REFERENCE TO RELATED APPLICATION

This application is a continuation-in-part of U.S. patent application Ser. No. 916,328, filed Jul. 17, 1992, now U.S. Pat. No. 5,340,772, by Rostoker, and a continuation-in-part of U.S. patent application Ser. No. 935,449, filed Aug. 25, 1992, now U.S. Pat. No. 5,300,813, by Rostoker.

TECHNICAL FIELD OF THE INVENTION

The invention relates to integrated circuit assemblies and more particularly to multi-tier (stacked) assemblies of semiconductor dies (chips).

BACKGROUND OF THE INVENTION

Semiconductor technology has shown a general trend towards dramatic increases in integrated circuit speed and density. Both of these trends are fueled by a general reduction in device (active element) geometries. As semiconductor devices become smaller, the distances between them on a semiconductor die become smaller, and parasitics (such as parasitic capacitances) and switching currents become smaller. In technologies such as CMOS, where overall current draw and switching speed characteristics are dominated by the effects of parasitics, the result is a reduction in total power consumption at the same time as switching speed is improved. Overall speed is further improved by the reduction in signal propagation time between active devices (e.g., transistors) resulting from the shorter distances involved. In today's high speed integrated circuitry based on sub-micron geometries, delays in the tens or hundreds of picoseconds can be appreciable.

Typically, integrated circuit dies (chips, or semiconductor dies) are diced (cut apart, or singulated) from a semiconductor wafer and are assembled into integrated circuit packages which have pins, leads, solder (ball) bumps, or conductive pads by which electrical connections may be made from external systems to the integrated circuit chip. These packages are then typically applied to circuit board assemblies comprising systems of interconnected integrated circuit chips.

The aforementioned dramatic improvements in integrated circuit speed and density have placed new demands on integrated circuit assemblies, both at the chip and circuit board levels. Without attendant improvements in these areas, much of the benefit of high device speed is lost. Wiring propagation delays and transmission line effects, in integrated circuit packages and on circuit board assemblies, which were once negligible are now significant factors in the overall performance of systems based on high-speed integrated circuitry. In order to achieve the potential higher system-level performance opportunities afforded by the new high-density technologies, it is necessary to reduce the amount of signal propagation time between integrated circuits.

Another significant factor in achieving high system-level performance is signal drive capability. Longer signal paths are susceptible to noise (cross-talk, etc.) and require low-impedance, high-current drive circuits on the integrated circuit chips (dies). Such circuits tend to occupy large portions of the die area (either reducing the area available for other circuitry or increasing the overall die size), and can introduce significant delays of their own. Clearly, shorter signal paths and their attendant low signal drive current requirements are desirable to achieve high performance.

In the prior art, a number of high density chip assemblies and packages have been proposed and implemented. One such technique is commonly known as "chip-on-board" technology, whereby integrated circuit dies are bonded directly to die mounting areas on a circuit board substrate (e.g., ceramic, fiberglass, etc.) and are wire bonded (with thin "bond wires") to traces on the circuit board in areas adjacent to the edges of the dies. The elimination of the traditional integrated circuit package permits chips to be placed much closer together than would otherwise be possible, thereby shortening signal paths and reducing delays.

Examples of prior-art "chip-on-board" technology may be found in Japanese Patent No. 60-250639, issued Dec. 11, 1985 to Kazunori Narita, and in Japanese Patent No. 53-39068, issued Oct. 4, 1978 to Yoshiharu Nagayama.

Another high-density, high-performance packaging technique in the prior art makes use of "flip chips", whereby solder bumps (or conductive polymer bumps, or the like) are provided on the top surfaces of integrated circuit dies which are then "flipped" and mounted to a substrate which has patterns of contact pads arranged in register with the solder bumps. The substrate is usually a printed circuit board, "silicon circuit board" ceramic substrate, or other suitable planar substrate with a conductive wiring pattern on it. The substrate is laid out to accommodate one or more such "flip chips", making high-density interconnection of integrated circuit chips possible. This technique permits even closer spacing of integrated circuit dies than the aforementioned chip-on-board technique, because connections are made under the dies, saving the space which would otherwise be occupied by bond wires.

Examples of various prior-art "flip-chip" constructions are found in U.S. Pat. No. 3,388,301, issued Jun. 11, 1968 to B. D. James; U.S. Pat. No. 4,545,610, issued Oct. 8, 1985 to Lakritz et al.; U.S. Pat. No. 4,190,855, issued Feb. 26, 1980 to Inoue; U.S. Pat. No. 4,811,082, issued Mar. 7, 1989 to Jacobs et al.; U.S. Pat. No. 4,926,241, issued May 15, 1990 to Carey; U.S. Pat. No. 5,039,628, issued Aug. 13, 1991 to Carey; U.S. Pat. No. 4,970,575, issued Nov. 13, 1990 to Soga et al.; U.S. Pat. No. 3,871,014, issued Mar. 11, 1975 to King et al.; Japanese Patent No. 61-142750, issued Jun. 30, 1986 to Toru Kawanobe; Japanese Patent No. 61-145838, issued Jul. 3, 1986 to Kishio Yokouchi; Japanese Patent No. 57-210638, issued Dec. 24, 1982 to Toshio Hida; and in "Wafer-Chip Assembly for Large-Scale Integration", IEEE Trans. Elec. Dev., Vol. ED-15, No. 9, September 1968.

For very high-density packaging, it is known in the prior art to use a combination of these two techniques (i.e., "flip-chip" and "chip-on-board") to provide multi-tier "flip-chip" assemblies. Examples of prior-art multi-tier flip-chip assemblies are found in U.K. patent application No. GB 2117564, filed on Mar. 26, 1982 by Talbot and Richer; Japanese Patent No. 60-94756, issued May 27, 1985 to Shiyuzou Akeshima; Japanese Patent No. 57-31166, issued Feb. 9, 1982 to Jiyunji Sakurai (hereinafter "SAKURAI"); and Japanese Patent No. 55-111151, issued Aug. 27, 1980 to Kenichi Oono.

The technique of "bump-bonding" is well known in the prior-art, and has a great many variations. Various examples of processes and techniques associated with bump bonding are given in U.S. Pat. No. 4,717,066, issued Jan. 5, 1988 to Goldenberg et al.; U.S. Pat. No. 5,066,614, issued Nov. 19, 1991 to Dunaway et al.; U.S. Pat. No. 5,074,947, issued Dec. 24, 1991 to Estes et al.; U.S. Pat. No. 4,700,276, issued Oct. 13, 1987 to Freyman et al.; and U.S. Pat. No. 4,817,850 issued Apr. 4, 1989 to Wiener-Avnear et al.. These patents represent a wide variety of techniques for providing bump connections. Hereinafter, the terms "bump bonding" and "bump contacts" will refer to these or any other suitable technique for providing raised electrical and mechanical connections between planar surfaces.

In a typical multi-tier flip-chip assembly of the prior art, a first integrated circuit die is attached (mounted) by its bottom surface to the top surface of a passive substrate. The top surface of the first die has a number of contact areas (e.g., bond pads or solder bumps). A first portion of the contact areas are wire bonded on a one-to-one basis to conductive traces on the top surface of the substrate. Another portion of the contact areas are arranged in a pattern to match a pattern of mating bump contacts disposed on a top (circuit side) surface of a second "flip chip" integrated circuit die, which is flipped over (inverted) onto the top surface of the first integrated circuit die such that the bottom side of the second "flip-chip" integrated circuit die is up and the pattern of its bump contacts aligns with pattern of the mating contact areas on the first integrated circuit die. The bump contacts are then "fused" or permanently connected to the contact areas (by heating of solder bumps, or polymerization or curing or conductive polymer bumps, or other suitable technique). This type of assembly is exemplary the prior-art concept of combining chip-on-board technology with flip-chip technology.

A technique for increasing circuit density using a flip-chip configuration is described in IBM Technical Disclosure Bulletin, Vol 28, No. 2, July, 1985, entitled "Mated Array Chip Configuration" (hereinafter "IBM-1") whereby identical semiconductor chips with common (interchangeable) input/output pads are mated together by what IBM describes as "conventional C4" (controlled collapse chip connection) chip-joining technology (a flip-chip joining method) in an offset configuration. More particularly, a first set of identical chips is mounted in a coplanar, closely spaced configuration, with gaps between the chips. A second set of chips, also identical to the each other and to the first set of chips is flip-chip mounted by bump contacts over the first set of chips, in a manner similar to that described hereinabove except that there is a very slight horizontal offset between the first and second sets of chips permitting each of the second set of chips to span one of the gaps between the first set of chips and make electrical connections with two of the first set of chips. Each of the second set of chips has a large (substantial) portion of its surface area over one of the first set of chips and a very small portion (just enough to make electrical connections with a few edge-positioned bump contacts) over another of the first set of chips. In this staggered configuration, it is possible to effectively double the density of a semiconductor assembly on a given area of substrate.

Inasmuch as the object of the IBM technique described in IBM-1 is to increase circuit density, a very large overlap is required between the faces of the first set of dies (chips) and the second set of dies. While this configuration doubles circuit density, it also doubles the amount of power being dissipated within the same area (e.g., the area of one chip), and can cause local heating or "hot spots" on the dies, if any appreciable amount of power is dissipated by the dies. In high-speed semiconductor devices, it is not uncommon for significant amounts of heat to be dissipated.

Further, since identical dies are used, this particular flip-chip configuration is limited to increasing the bit densities of arrays of memories or functional devices, and is not suited to stacking dissimilar chips having diverse functions.

One problem with chip-on-board assemblies is the amount of time and expense required to attach the bond wires to the dies. While this process is largely automated, bond wires must still be attached to the die one at a time. This process can become expensive where large numbers of dies are involved. The flip-chip technique overcomes this problem.

A typical prior art "silicon circuit board" using flip-chips has a passive substrate material with wiring patterns, a number of flip-chips disposed on one surface and connected via bump connections to selected ones of the conductive traces.

Double-sided assemblies are also known in the prior art. For example, a multi-layer ceramic (or similar) printed substrate has contact areas are disposed on both sides of the substrate. Integrated circuit dies are "flipped" onto both sides of the passive substrate. The same technique may be applied to chip-on-board technology to provide double-sided chip-on-board assemblies.

Depending upon the type of circuitry used, flip-chip assemblies may have power dissipation problems. If one chip is being assembled face-to-face with another, the power dissipated by the two chips in close proximity may cause local heating, leading to eventual device failure. Careful thermal design of flip-chip assemblies is necessary to overcome this problem. One approach in the prior art has been to encapsulate the assembly in a thermally conductive compound which is attached to a good heat sink, helping to eliminate the local heating problem Multi-tier die packages have been employed in the prior-art to increase packaging density. In such packages a multi-tier ceramic package assembly having alternating patterned conductive traces and insulating ceramic layers arranged in a "sandwich" configuration is employed. A centrally located first opening in a first inner insulating layer exposes a portion of the underlying layers. A first set of patterned conductive traces along the top of the layer extend to the edges of the first opening. A second insulating layer, located above the first insulating layer has a larger centrally located second opening which exposes the first opening, a portion of the first insulating layer around the first opening, and a portion of the first set of patterned conductive traces around the periphery of the opening. A second set of patterned conductive traces extend along the top surface of the second insulating layer to the edges of the second opening therein. A third insulating layer, located above the first and second insulating layers, has a still larger centrally located third opening which exposes the first and second openings in the underlying layers and a portion of the second set of patterned conductive traces around the periphery of the second opening. Progressively larger openings in other insulating layers and additional sets of patterned conductive traces are added in this fashion, as required, to form a "stepped" opening into the package body.

Integrated circuit dies are then assembled into a pyramid-shaped stack with insulating spacers between the dies. The die stack is assembled into the stepped opening. As many dies are assembled as there are levels in the "stepped" opening in the ceramic package body. Bond pads are exposed around the periphery of each die. Bond wires connect the bond pads of each die to patterned conductive traces on corresponding "levels" of the stepped package body.

In prior-art multi-chip assemblies employing wire bonding, bond wires are attached with equipment that makes the connections one at a time. The process of making these connections can become both time consuming and expensive.

One prior-art technique, disclosed in "SAKURAI" eliminates the bond wires by making a flip-chip assembly out of a stack of dies, providing bump contacts around the edges of each die in the stack, then flipping the assembly onto a ceramic package assembly which has stepped openings sized such that the steps of the flip-chip assembly, formed by the edges of the dies, rest on the edges of the openings in the package assembly. Conductive traces on the ceramic package assembly align with the bump contacts, providing electrical connections thereto, as well as facilitating the mechanical mounting of the stacked die assembly.

While this type of assembly solves many problems, it presents alignment problems of its own. The relative heights of the die-insulator stack and the layers of the ceramic substrate assembly must be carefully controlled if all of the dies are to rest properly on the corresponding layer of the package. Shifts in relative positioning of the ceramic layers (i.e., sliding of one against the other during the assembly process) must be minimized, as must shifts in relative positioning of the dies in order to achieve proper alignment of bump contacts with conductive traces. Errors in placement of layers and/or dies are cumulative, so extreme precision is required of the assembly process.

The aforementioned stacked die assemblies do not provide for inter-die connections, other than by means of internal connections in the ceramic substrate assembly (package) or by means of external wiring. Since inter-die connections may be radically different from one application to another, it may be necessary to provide a different custom ceramic substrate assembly for each application, preventing the use of standard packaging. If standardized packaging is used, then it may be necessary to accomplish inter-die connections external to the package. This lengthens signal paths and necessitates extra pins on the package for signals which might otherwise remain internal to the package. When signals are brought out of the package, all of the aforementioned attendant signal drive issues re-surface, partially eliminating the benefit of the high-density packaging technique.

Various prior-art schemes are available to assist in positioning of flip-chip assemblies. Some examples are found in U.S. Pat. No. 3,811,186, issued on May 21, 1974 to Larnerd et al; U.S. Pat. No. 4,949,148, issued on Aug. 14, 1990 to Bartelink; and in Japanese Patent No. 60-49638, issued Mar. 18, 1985 to Kazuhito Ozawa. These techniques deal well with flip-chip assemblies, but alignment of chips bonded by their blank back side to a substrate is somewhat more difficult to achieve.

In summary, prior art techniques for stacking dies suffer from a number of problems, including local heat build-up, proliferation of bond wires, proliferation of pins (external package connections), and alignment difficulties. While one or more of these problems are addressed, in part, by some of the prior art techniques, no prior-art technique fully addresses all of these problems simultaneously. For example, while the multi-tier technique of SAKURAI eliminates the use of bond wires, it does not solve the local heat build-up problem or provide for inter-die connections.

Another problem remaining unaddressed by the prior art has to do with wiring density. As the number of interconnections increases in flip-chip applications, it can become difficult to find short routing paths around the connections to the die. Depending upon the substrate medium used, a limited number of wiring layers may be available, requiring long wiring paths or jumpers. Alternatively, for some substrate media, it may become necessary to use additional wiring layers, increasing the overall cost of the assembly.

Another insufficiency with the prior can be attributed to an emerging trend towards semiconductor devices with extremely large amounts of I/O (external connections). The periphery of a die (i.e., an area, or band, just inward the edges of the die) is used to provide external connections, typically by providing bond pads to which bond wires (e.g.) may be connected. Many modern integrated circuit designs are "pad limited." In other words, a die of a given area has a fixed, limited amount of periphery available for bond pads. On many modern integrated circuit designs, especially as transistor geometries are decreased, the peripheral (bonding) area of a die is simply not sufficient for the large number of bond pads desired, when the die is sized just large enough to hold the active circuitry of the design.

Commonly owned, co-pending U.S. patent application Ser. No. 916,328, filed Jul. 17, 1992 by Rostoker discloses a technique for providing greater amount of I/O (e.g., bond pads) by using "certain non-square" die shapes which increase the periphery to area ratio for the die, as compared with square and low-aspect-ratio rectangular dies. Hence, the "certain non-square" die shapes disclosed therein provide for a greater amount of I/O in a die of a given area. However, it may well be the case that "standard" packaging techniques, namely those designed to accommodate "standard" square and low-aspect-ration rectangular dies, will not adapt well to the "certain non-square" die shapes. For example, signal paths may become unacceptably long.

DISCLOSURE OF THE INVENTION

It is an object of the present invention to provide improvements in multi-chip semiconductor assemblies, especially in stacked multi-chip assemblies.

It is another object of the present invention to provide multi-chip semiconductor assemblies that do not require bond wires.

It is a further object of the present invention to provide a technique for using flip-chip dies-to bridge a gap between and connect to dies mounted to a substrate, with minimal (versus substantial) overlap of the faces of the dies.

It is a further object of the present invention to provide "brickwork" assemblies which do not require the use of bond wires.

It is a further object of the present invention to provide multi-chip assemblies which minimize wiring lengths between dies.

It is a further object of the present invention to provide means for reducing the complexity of signal routing on a substrate to which the multi-chip assembly is mounted.

It is another object of the present invention to provide a technique for increasing the amount of I/O which can be derived from a semiconductor die assembly, within given space limitations (die footprint).

It is another object of the present invention to provide a technique for increasing the ratio of I/O area to circuit element area for a semiconductor die assembly.

According to the invention, flip-chip assemblies using exclusively "limited-overlap" connection may be assembled into "brickwork" arrays. "Limited-overlap", connections of flip-chips are characterized by bump contacts disposed along one edge of a face of each of two semiconductor dies. The dies are assembled in a flip-chip configuration such that their faces only overlap in the immediate vicinity of the bump contacts, i.e., just enough to effect bump connections between the two dies. A "flipped" die will bridge the gap between two dies mounted to a substrate, forming limited overlap connections with both. In this configuration, only a very small portion of the surface area of the "flipped" die lies face-to-face with the dies on the substrate, thus minimizing the aforementioned local heating problem. More particularly, the active circuit element area of the dies are substantially non-overlapping.

Further according to the invention, double-sided flip-chip dies are provided, comprising a planar semiconductor substrate, active semiconductor devices formed in at least one major surface (face) of the planar semiconductor substrate, insulating layers over the top and bottom surfaces of the die, raised bump contacts disposed on the insulating layer over the top surface of the substrate, and raised bump contacts disposed on the insulating layer over the bottom surface of the substrate.

In one embodiment, conductive vias are provided which connect select raised bump contacts to internal conductors within the die.

In another embodiment, conductive feedthroughs are provided which provide connections between selected raised bump contacts on opposite sides of the die.

In another embodiment, conductive jumpers are provided between selected raised bump contacts on the same side of the die.

In another embodiment, the conductive jumpers are disposed on the insulating layer on the surface of the die.

In another embodiment, the conductive jumpers are provided as buried conductors within the die, and which are contacted by means of conductive vias extending from the raised bump contacts connected by the jumpers.

Other embodiments are disclosed which provide assemblies based upon the double-sided flip-chip dies described hereinabove. In one such embodiment, a multi-chip semiconductor arrangement is provided, made up of a substrate having a plurality of raised bump contacts disposed upon a surface thereof, a double-sided flip-chip die having a first plurality of raised bump contacts disposed on one major surface thereof and a second plurality of raised bump contacts disposed on a second major surface thereof, and a second flip-chip die having raised bump contacts disposed on a first surface thereof. The double-sided flip-chip die(s) is (are) disposed on the surface of the substrate such that its (their) first major surface faces the surface of the substrate. The second flip-chip die is disposed on the second major surface of the double-sided flip-chip die. The raised bump contacts on the substrate are arranged to align with and are fused to corresponding ones of the first plurality of raised bump contacts on the first major surface of the at least one first double-sided flip-chip die, forming permanent mechanical and electrical connections therebetween. The raised bump contacts on the second major surface of the double-sided flip-chip die are arranged to align with and are fused to corresponding ones of the raised bump contacts on the first surface of the second flip-chip die forming permanent mechanical and electrical connections therebetween.

In another embodiment, an additional "tier" of a multi-tier array is provided by using a double sided die as the second flipchip die, and similarly disposing a third flip-chip die on top of the second flip-chip die.

In another embodiment, the substrate is a planar semiconductor material having active electronic devices integrated in the surface thereof.

In another embodiment, a multi-tier brickwork assembly is provided by disposing two double-sided flip-chip dies on the surface of the substrate, spaced apart to form a gap therebetween. A second flip chip die is larger in at least one dimension than the gap and overlies the gap, spanning it such that a second flip-chip die rests on the a portion of the top major surfaces of each of the two double-sided flip-chip dies. Raised bump connections are formed between the second flip-chip die and the double-sided dies.

Another embodiment provides a variation of a "brick-work" assembly, which comprises a substrate having a die-receiving surface, a first and a second semiconductor die, each having an array of bump contacts disposed on its face surfaces along an edge, and a third semiconductor die with an array of bump contacts disposed along each of two edges of its face surface. The first and the second semiconductor dies are each mounted by a mounting surface to the die-receiving surface of the substrate, oriented such that a gap is formed between the edges of the first and second semiconductor dies along which the bump contacts are disposed. The third semiconductor die is flipped over onto the first and second semiconductor dies, spanning the gap between them and forming electrical connections between corresponding bump contacts on the third die and the first die, and between corresponding bump contacts on the second die and the third die (As shown generally with respect to FIGS. 1a and 1b.)

In other embodiments, a number of double-sided flip-chip dies are arranged in a pattern on the substrate such that a polygonal opening is defined between them. Another flip-chip die, larger than the opening, spans the opening, resting on the double-sided flip-chips, and forming raised bump connections thereto.

In another embodiment, three double-sided flip-chip dies are arranged to form a triangular opening between them. A triangular-shaped flip-chip die, larger than the opening, spans the opening and rests on the three double-sided flip-chip dies, forming raised bump connections thereto.

In another embodiment, four double-sided flip-chip dies are arranged to form a rectangular opening. A rectangular flip-chip die, larger than the opening, spans the opening and rests on the four double-sided flip chip dies, forming raised bump connections thereto.

In another similar embodiment, four trapezoidal double-sided flip-chip dies form the rectangular opening.

Further according to the invention, techniques are provided for increasing bond pad density within a given footprint area. A "footprint" is the area of an assembly as viewed in plan view. Various embodiments of these techniques are disclosed.

In these embodiments, bond pad density within a given footprint area is increased by providing a first semiconductor die having a first surface (face) and a second surface, providing bond pads in a peripheral area (within edges of the die) on first surface, providing one or more second semiconductor dies, each having a top surface, a bottom surface, and bond pads provided in a peripheral area on the top surface of the die(s), mounting the second (and subsequent) semiconductor die(s) by its (their) bottom surface to the first (or top) surface of the first (or underlying) semiconductor die.

By mounting the second die(s) to the first, increased overall peripheral area is achieved, within a given footprint area (i.e., the area of the first die), thereby providing more space for bond pads (namely, for I/O connections). This allows for more I/O, in absolute terms, as well as for an increased ration of aggregate I/O area to circuit element area.

In another embodiment, the method further provides for mounting the second surface of the first semiconductor die to a substrate.

In another embodiment, the second semiconductor die is a double-sided flip-chip die.

In another embodiment, the first semiconductor die is a double-sided flip-chip die, the substrate has conductive pads disposed on a mounting surface thereof, and the first semiconductor die is mounted to the conductive pads on the substrate.

Other objects, features and advantages of the invention will become apparent in light of the following description thereof.

DETAILED DESCRIPTION OF THE INVENTION

Many of the problems with prior-art flip-chip dies arise from the fact that bump connections are only provided on one die surface. By providing two-sided flip-chip dies having bump connections on both major surfaces (i.e., top and bottom), most of these problems are eliminated. In some cases, however, it is still desirable to work with conventional, single-sided flip-chip dies either alone or in combination with two-sided flip-chip dies, usually because the single-sided flip-chip dies are already available.

Figure 2A:
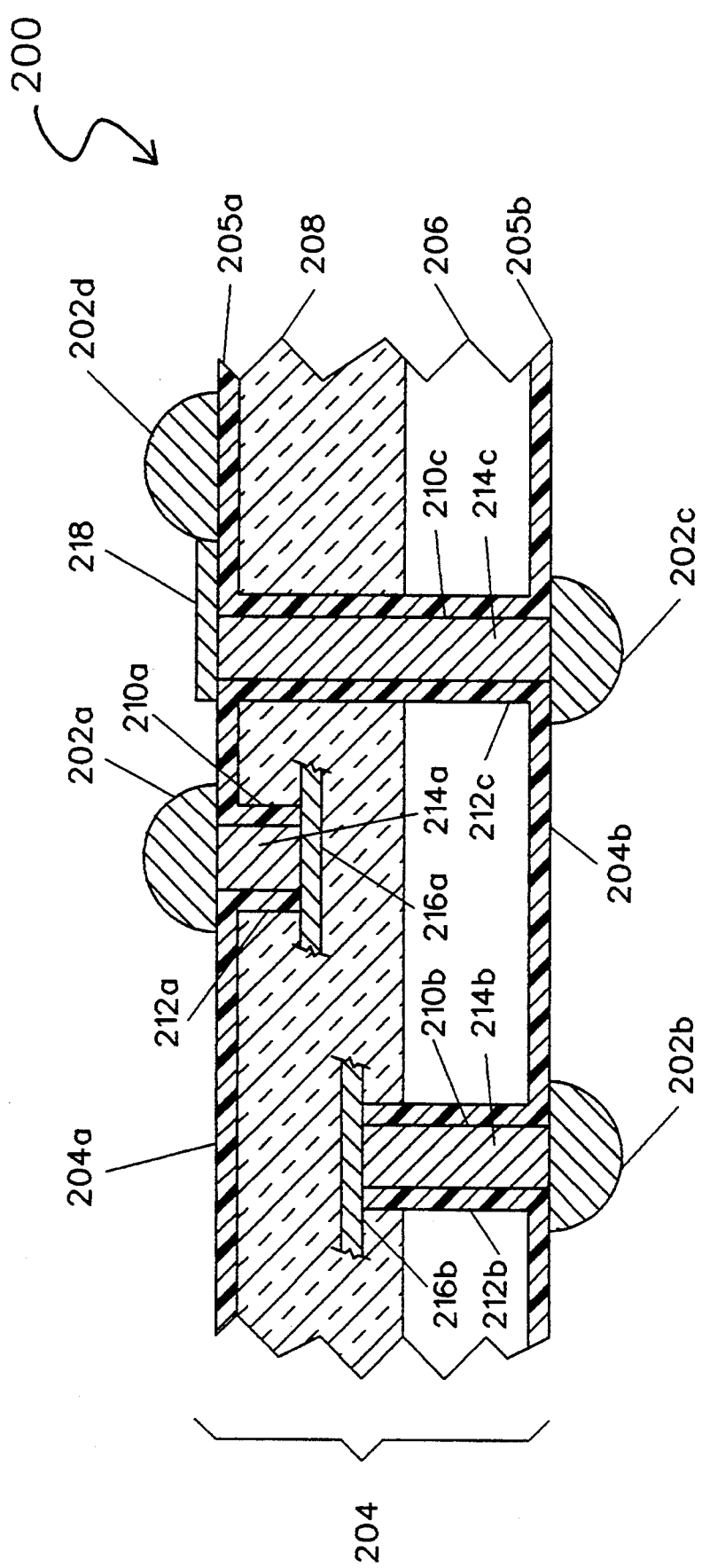
FIGS. 2a–2c are cross-sectional views of two-sided flip-chip dies according to the present invention.

FIG. 2a shows a cross-sectional view of section 200 of a two-sided flip chip die 204, according to the present invention, which has bump connections 202a and 202d on a first major (top) surface 204a, and bump connections 202b and 202c on a second major (bottom) surface 204b. An insulating layer 205a (typically $SiO_2$) covers the top surface 204a, and another similar insulating layer 205b covers the bottom surface 204b. An active element area 208 contains active semiconductor devices, formed by standard integrated circuit processing techniques into a substrate material 206.

On typical prior-art dies, the bottom surface is not covered with an insulating layer, but exposes substrate material 206, which is bonded directly to a grounded conductive mounting pad. Since it is one object of the invention to provide bump contacts on both top and bottom surfaces of a two-sided flip-chip die, it is necessary to provide an insulating layer 205b to prevent shorting of those bump contacts to the substrate material 206.

A hole 212a, formed by etching, ion milling, or other suitable process, extends from the top surface into die 204 down to and exposing a conductor 216a. Insulating material 210a, typically $SiO_2$, electrically insulates the walls of the hole 212a from contact with other active semiconductor devices. A conductive plug 214a (e.g., tungsten) is deposited into the hole 212a, forming a conductive via from the surface 204a to the conductor 216a. Bump contact 202a, electrically conductive to plug 214a, is formed on the top surface 204a of die 204, completing an external bump contact to conductor 216a.

Another hole 212c is bored completely through die 204 (by ion milling or etching, etc.). Insulating material 210c insulates the walls of hole 212c from contact with active semiconductor devices. Another conductive plug 214c is deposited into hole 212c, completely filling it. a conductor 218 (e.g., aluminum) is disposed on top surface 204a such that it makes electrical contact with one end of conductive plug 214c. Bump contact 202d is disposed on top surface 204a such that it is electrically conductive to conductor 218. Any contact arrangement such as this where bump contacts (202c and 202d) on opposite sides of a die are connected electrically will hereinafter be referred to as a "feedthrough" contact arrangement, and the bump contacts so arranged will be referred to as "feed-through" contacts.

The bottom surface 204b of the die 204 is processed by flipping the die, and processing the die again, using similar techniques. Since dies are usually formed in large numbers on a semiconductor wafer and separated after all processing steps are complete, this usually involves flipping the semiconductor wafer on which the dies are formed, re-orienting the wafer so that further processing steps are aligned with previously processed features, and performing additional processing steps on the wafer. A hole 212b, insulated by insulating material 210b and containing a conductive plug 214b, is formed in bottom surface 204b such that contact is formed between conductive plug 214b and a conductor 216b. Bump contacts 202b and 202c are formed on the bottom surface 204b such that bump contact 202b makes electrical contact with conductive plug 214b, and bump contact 202c makes electrical contact with conductive plug 214c. Conductors 216a and 216b may be internal wiring (metallization layers), or gate poly. Bump contacts 202c and 202d are electrically conductive to one another through conductive plug 212c and conductor 218, forming a "feedthrough" connection. Conductor 218 provides for horizontal displacement of bump contact 202d relative to bump contact 202c. Such connections are particularly useful in stacked arrays of dies for passing signals between non-adjacent dies. When dies of this type are used, inter-die connections may be made between adjacent and non-adjacent dies.

Figure 2B:
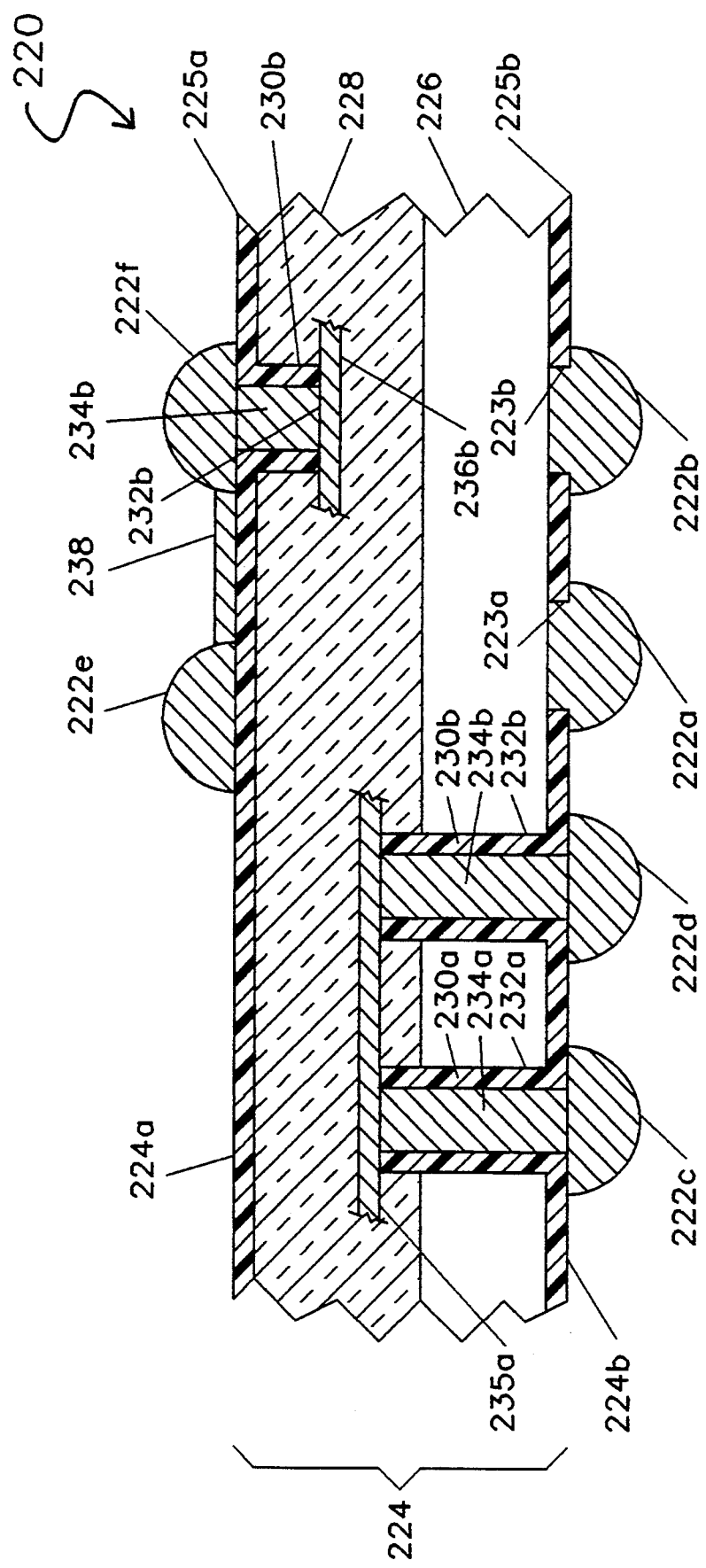

FIG. 2b is a cross-sectional view of another section 220 of a two-sided flip chip die 224, embodying other aspects of the present invention. Top surface 224a and bottom surface 224b of die 224 are covered with insulating layers 225a and 225b, respectively.

In one aspect of this embodiment, bump contacts 222a and 222b provide electrical contact to a the substrate material 226 of the die. In a typical integrated circuit die application, the substrate material 226 should be grounded or held at a constant potential. Openings 223a and 223b formed in insulating layer 225b provide access to substrate material 226. Bump contacts 222a and 222b are disposed on the bottom surface 224b over holes 223a and 223b, respectively, such that they make electrical contact with substrate material 226.

In another aspect of this embodiment, jumpered bump contact pairs are formed on either or both major surfaces of the die. To this end, a hole 232c, formed by etching, ion milling, or other suitable process, extends from the top surface 224a into die 224 down to and exposing a conductor 236b. Insulating material 210c electrically insulates the walls of the hole 232c from contact with other active semiconductor devices. A conductive plug 234c is deposited into the hole 232c, forming a conductive via from the surface 224a to the conductor 216c. A bump contact 222f is disposed on top surface 224a, positioned over and making electrical contact with conductive plug 234c. Additionally, a surface conductor 238 (also called a "surface jumper") forms an electrical connection with another bump contact 222e. Hereinafter, electrically connected bump contacts on the same surface of a die will be referred to as "jumpered contacts". In the case of jumpered contacts 222e and 222f, a connection to an internal signal on internal conductor 236b is also made.

Another method of jumpering bump contacts is shown with respect to bump contacts 222c and 222d. Two holes are formed in the bottom surface 224b of the die 224, both extending into the die to an internal conductor 236a. The walls of the holes 232a and 232b are insulated with insulating material 230a and 230b, respectively, and are then filled with conductive plugs 234a and 234b, respectively, each of which makes electrical contact with internal conductor 236b. Bump contacts 222c and 222d are then disposed on the bottom surface 224b such that bump contact 222c covers and makes electrical contact with conductive plug 234a, and bump contact 222d covers and makes electrical contact with conductive plug 234b. Bump contacts 222c and 222d are electrically conductive to one another via conductive plugs 234a and 234b, and internal conductor 236a. In this case, internal conductor 236a is referred to as a "buried jumper" since it forms the connection between bump contacts 222c and 222d, and is "buried" within the die. Typically, internal conductor 236a will be part of a patterned metallization layer within the die, and may connect to active devices within the die, or may be an isolated conductor.

Jumpered contacts provide a means for solving difficult routing problems in a flip-chip assembly by providing an effective "extra" layer of wiring, helping to keep signal paths in such assemblies as short as possible.

Figure 2C:
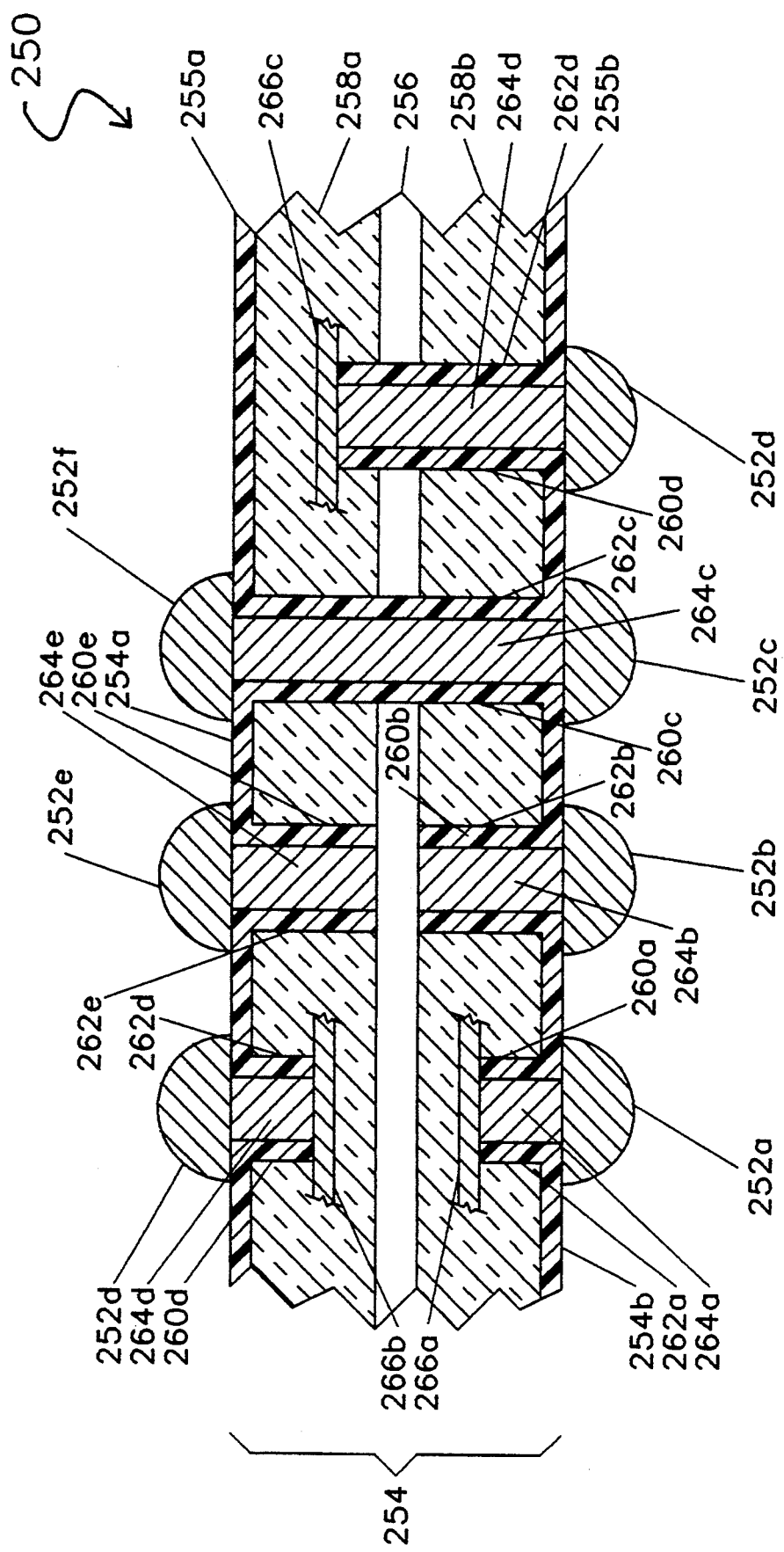

FIG. 2c is a cross-sectional view 250 of a two-sided flipchip 254 embodying another aspect of the present invention, active elements formed in both major surfaces of the die. In this embodiment, a top active element area 258a is formed into a substrate 256 from a top surface 254a of a die 254, and a bottom active element area 258b is formed into the same substrate from a bottom surface 254b of the same die 254, in separate sets of processing steps performed on opposite sides of a semiconductor wafer into which die 254 is formed. Top surface 254a is covered by an insulating layer 255a, and bottom surface is covered by an insulating layer 255b. A hole 262e extends from the top surface of the die 254 through the insulating layer 255a and the top active element area 258a to the substrate material 256. A conductive plug 264e, insulated from the walls of the hole 262e by insulating material 260e, makes electrical contact with the substrate 256. A bump contact 252e is formed on the top surface 254a over the conductive plug 264e, creating an external electrical connection to the substrate. A similar bump connection to the substrate comprising hole 262b insulating material 260b, conductive plug 264b, and bump contact 252b is formed in the bottom surface 254b of the die 254 through the insulating layer 255b and the bottom active element area 258b.

A pair of feed-through bump contacts 252c and 252f on the bottom surface 254b and top surface 254a, respectively, of die 254 are electrically joined by a conductive plug 264c, disposed in a hole 262c which is bored completely through the die by ion milling, etching, or other suitable processing technique. Insulating material 260c insulates the plug 264c from the walls of the hole 262c, preventing the plug 264c from making contact with either the top active element area 258a, the bottom active element, area 258b, or the substrate material 256.

A bump contact 252d is formed on the top surface 254a of the die and connected to an internal conductor 266b in the top active element area 258a via a conductive plug 264d disposed in a hole 262d extending through the top surface 252a, the insulating layer 255a, and extending into the top active element area 258a to internal conductor 266b. Plug 264d is insulated from the top active element area by insulating material 260d.

A similar bump contact 252a is formed on the bottom surface 254b of the die and connected to an internal conductor 266a in the bottom active element area 258b via a conductive plug 264a disposed in a hole 262a extending through the bottom surface 252b, the insulating layer 255b, and extending into the bottom active element area 258b to internal conductor 266a. Plug 264a is insulated from the top active element area by insulating material 260d.

Another bump contact 252d on the bottom surface 254b of the die 254 is connected to an internal conductor 266c in the top active element area 258b. This connection is made via a conductive plug 264e disposed in a hole 262d extending through the bottom surface 254b, the bottom insulating layer 255b, the bottom active element area 258b, the substrate material 256, and into the top active element area 258a to internal conductor 266c. Insulating material 260e prevents undesired contact between the conductive plug and either active element areas 258a or 258b, or substrate material 256.

Using the techniques shown in FIGS. 2a–2c, flip-chip dies may be fabricated which have contacts on both sides of the die, and where bumped feed-through connections, bump connections to internal conductors from either side of the die, bump connections to the substrate material from either side of the die, and/or internally or surface jumpered bump contacts on the same or opposite sides of the die. Active circuit elements may be integrated into one or both sides of the die. Connections may be offset on either side of the die using either surface or buried conductors. Any of these technique and features of the present invention may be used alone or in combination to provide extremely flexible flip-chip dies.

The shapes of the dies described with respect to FIGS. 2a–2c are not defined hereinabove. While one would normally assume that they would be of a rectangular shape, their shape is immaterial to the invention. The dies may be of any suitable shape, including square, rectangular, and "certain non-square" shapes described in commonly-owned co-pending patent application Ser. No. 916,328, filed Jul. 17, 1992 by Rostoker. These non-square shapes include triangular, trapezoidal, elongated rectangular, parallelogram-shaped, and others.

While the foregoing discussion has concentrated on the construction of double-sided flip-chips, the following discussion will concentrate on assemblies constructed using these double-sided flip-chips.

Figure 3A:
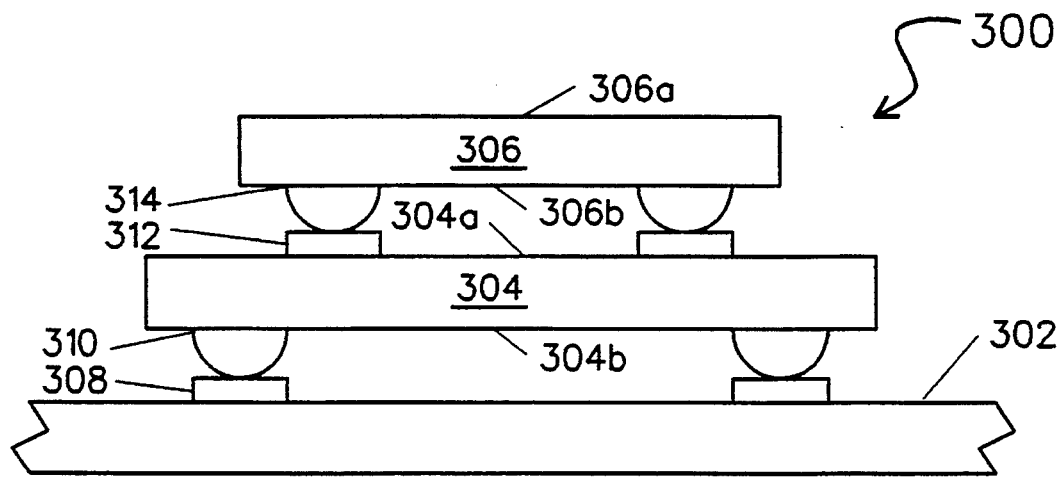
FIGS. 3a–3b are side views of multi-tier flip-chip assemblies according to the present invention.

FIG. 3a is a side view of a multi-tier flip-chip assembly 300 using a double-sided flip-chip die 304, thereby requiring no bond wires. A planar substrate 302 has conductive pads 308 disposed on a top surface and arranged such that their placement matches and aligns with corresponding solder bump contacts 310 on one surface 304 of double-sided flip-chip die 304. This die 304 is fabricated according to techniques discussed previously with respect to FIGS. 2a–2c. Double-sided flip-chip die 304 is "flipped" onto the substrate 302 and solder bumps 310 are re-flowed to form permanent connections with corresponding conductive pads 308. Conductive pads 312 are disposed on the opposite surface 304a of die 304 and are arranged such that they align with corresponding solder bump contacts on one surface 306b of a normal (prior-art type) flip-chip die 306. Die 306 is "flipped" onto die 304 and solder bump contacts are then re-flowed, forming permanent connections with corresponding conductive pads 312. A blank back surface 306a of die 306 faces upward. Substrate 302 may be a "silicon circuit board" a ceramic circuit board, or a planar surface in a package assembly.

A multi-tier arrangement of this type provides for simple assembly, without bond wires. Further, internal connections, jumper contacts and feed-through contacts can provide completely flexible interconnection of the flip-chip die 306 with signals on both the double-sided flip-chip die and the substrate. Assemblies of this type would be impossible without the double-sided flip-chip die of the present invention.

Figure 3B:
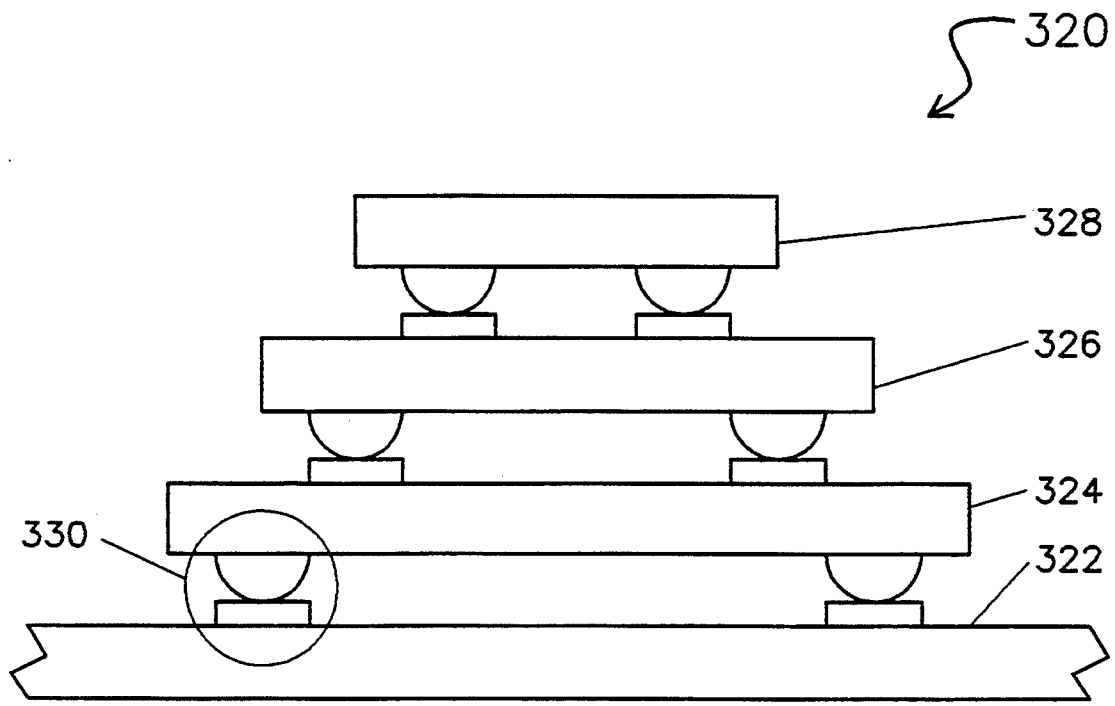

FIG. 3b is a side view of an extension of the technique shown in FIG. 3a to another tier. A multi-tier file-chip assembly 320 makes used of two double-sided flip-chip dies 324 and 26, a normal flip-chip die 328 and a substrate 322. Bumped connections 330 are provided between the substrate 322 and die 324, between die 324 and die 326, and between die 326 and die 328. Again, as before, the techniques discussed hereinabove permit fully generalized signal interconnections between the dies 324, 326, 328 and the substrate 322, without any bond wires.

It should be noted that the prior-art flip-chip dies shown in FIGS. 3a and 3b may be replaced with double sided flip-chip dies according to the present invention, leaving the top layer of the topmost die unconnected.

The assemblies of FIGS. 3a and 3b provide for extremely high circuit density and very short signal paths, both very desirable attributes of high density integrated circuit packaging, but assemblies of this type must be used judiciously if there is to be any significant power dissipated in any of the chips. The aforementioned heat build-up problems can occur in assemblies of this type because of the face to face orientation of the dies. The assemblies shown in FIGS. 4a–4d address this problem, among others.

In order to limit the amount of overlap of different tiers of multi-tier flip-chip assemblies, a style of flip-chip assembly using exclusively "limited-overlap" flip-chip connections is used, whereby the overlap between two dies is only as much as is required to effect electrical/-mechanical connections therebetween. (It is implicit in flip-chip assemblies that the electrical connections between flip-chips are also mechanical connections which serve to hold the "flipped" chips in place.) FIGS. 4a–4d illustrate this type of interconnection.

Figure 4A:
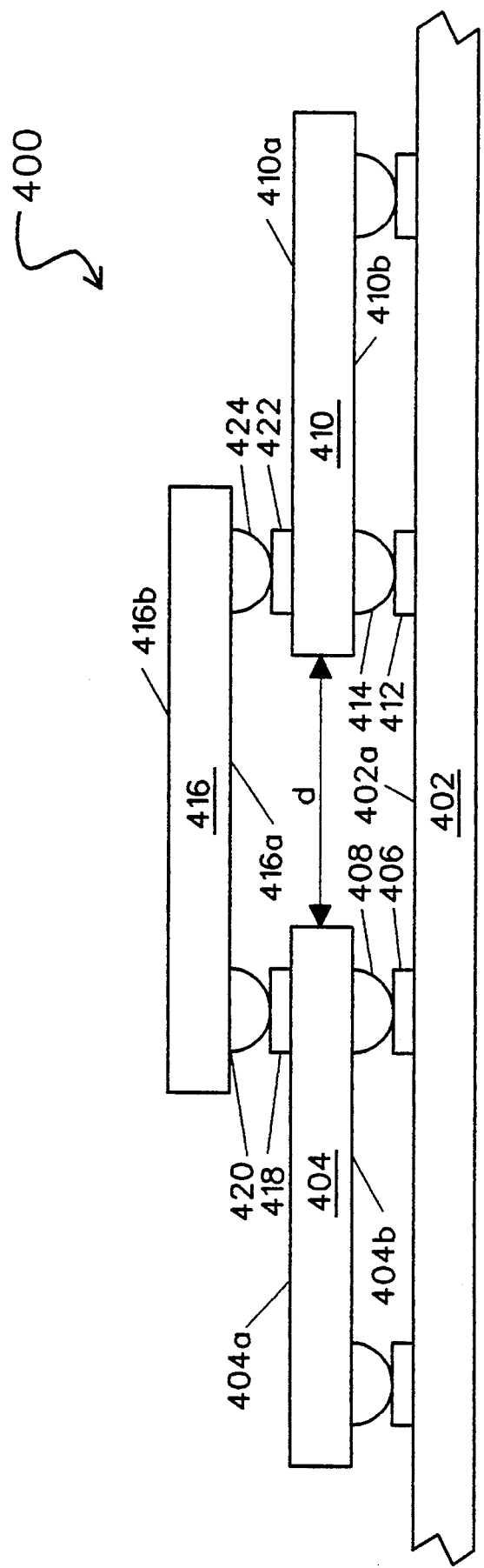
FIG. 4a is a side view of a flip-chip brickwork assembly, using two-sided flip-chip dies, according to the present invention.

FIG. 4a is a side view of a flip-chip brickwork assembly 400 according, to the present invention, wherein two spaced-apart double-sided flip-chip dies 404 and 406 are mounted to a top surface 402a of a planar substrate 402, and are "bridged" by another flip-chip die 416. Double-sided flip-chip die 404 has solder bump contacts 408 disposed on a bottom surface 404b and conductive pads 418 disposed along an edge of a top surface 404a. Double-sided flip-chip die 420 has solder bump contacts 414 disposed on a bottom surface 410b and conductive pads 422 disposed along an edge of a top surface 410a. Substrate 402 has conductive pads 406 and 412 disposed on its top surface 402a. Conductive pads 406 on the substrate 402 are arranged to align with corresponding solder bump contacts 408 on the bottom surface 404a of die 404. Conductive pads 412 on substrate 402 are arrange to align with corresponding solder bump contacts 414 on the bottom surface 410b of die 410 and are positioned to space dies 404 and 410 apart by a distance "d". A third normal flip-chip die 416, greater than "d" in width, overlies and spans the distance "d" between dies 404 and 410, and has solder bump contacts 420 and 424 arranged on its bottom surface 416a such that solder bump contacts 420 align with conductive pads 418 on the top surface 404a of die 404 and such that solder bump contacts 424 align with conductive pads 422 on the top surface 410a of die 410. After all of the dies have been positioned, the solder bump contacts are re-flowed forming permanent electrical and mechanical connections. A top surface 416b of die 416 is unopposed.

By bridging the gap between dies 410 and 404, die 416, the assembly is built such that none of the dies are arranged face-to-face. The resulting connections are the aforementioned "limited-overlap" connections, which only overlaps a small portion of the surface areas of the two dies to effect electrical connections therebetween. While this arrangement requires more substrate surface area than the multi-tier arrangements of FIG. 3a and 3b, it can tolerate greater power dissipation. Further, the gap underlying die 416 between dies 404 and 410 provides a natural convection cooling channel. Alternatively, forced air flow could be provided, or the entire assembly could be encapsulated in a thermally conductive medium in contact with a good heat sink.

As before, the double-sided flip-chip dies of the present invention provide for fully general signal interconnection within the assembly without the use of bond wires.

FIG. 4a illustrates the general approach to building flipchip brickwork assemblies by flipping a die across a gap between two or more spaced-apart double-sided flip-chip dies, and illustrates the die-to-die and die-to-substrate connection technique. The following discussion with respect to FIGS. 4b–4d is concerned with various physical brickwork configurations using rectangular and non-rectangular dies.

Figure 4B:
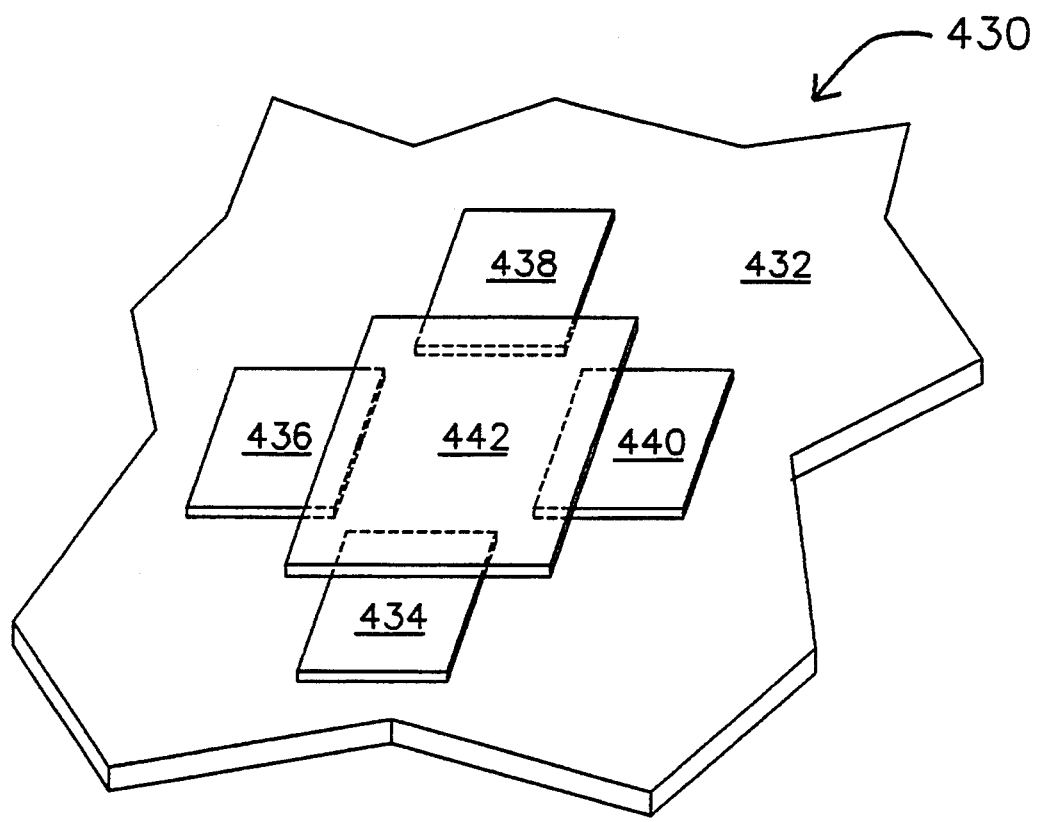
FIG. 4b is a view of a flip-chip brickwork assembly according to the present invention, using low-aspect ratio rectangular (e.g., square) dies.

FIG. 4b is a view of a two-tier brickwork assembly 430, using four rectangular double-sided flip-chip dies 434, 436, 438, and 440, all mounted to a substrate 432 and arranged such that they define a rectangular opening between them. A rectangular flip-chip die 442, larger than the opening between the four double-sided flip chip dies 434, 436, 438, and 440, is disposed overlying and spanning the opening. Connections are formed between die 442 and dies 434, 436, 438, and 440 and between dies 434, 436, 438, and 440 and substrate 432 in the manner described hereinabove with respect to FIG. 4a.

One possible application for a configuration of this type involves four microprocessors (434, 436, 438, 440) in communication with one another via a multi-port RAM (442). Another possible application might be a single microprocessor (442) in communication with four peripheral devices (434, 436, 438, 440).

Figure 4C:
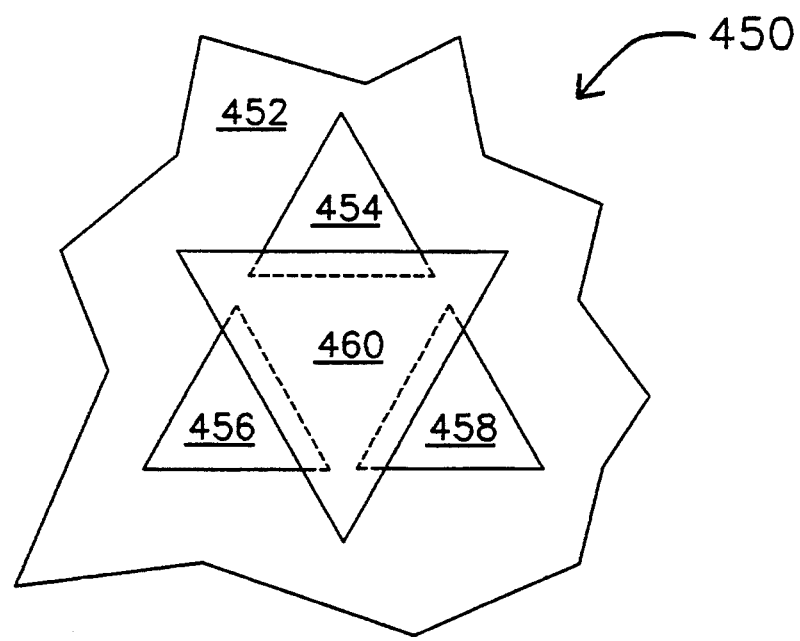
FIG. 4c is a plan view of a flip-chip brickwork assembly using triangular dies, according to the present invention.
Figure 4D:
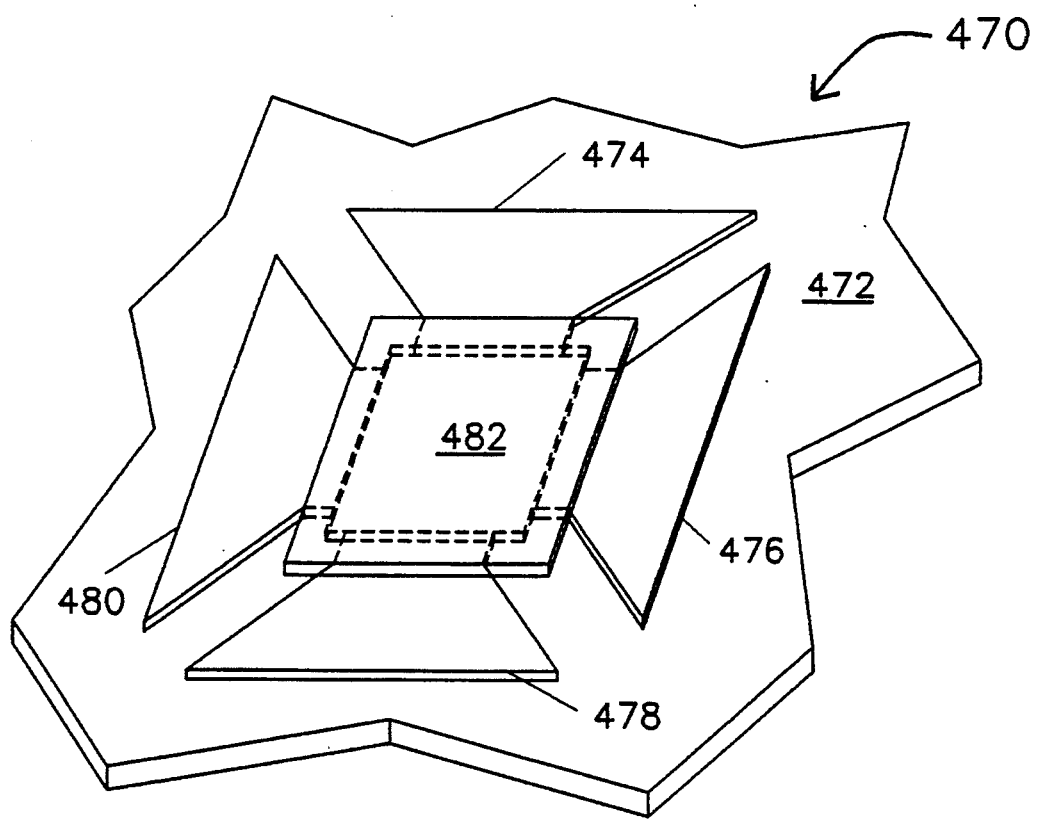
FIG. 4d is a view of a flip-chip brickwork assembly using trapezoidal dies, according to the present invention.

FIG. 4c is a plan view of a brickwork assembly 450 using three triangular double-sided flip-chip dies 454, 456, and 458, mounted to a substrate 452 such that a triangular opening is formed between them. A triangular-shaped flip-chip die 460, larger than the triangular opening is disposed overlying and spanning the opening. Die-to-die connections between dies 454, 456, 458, and 460 and die-to-substrate connections between substrate 452 and dies 452, 454, and 456 are formed as described hereinabove with respect to FIG. 4a.

FIG. 4d is a view of a flip-chip brickwork assembly 470 using four trapezoid-shaped double-sided flip-chip dies 474, 476, 478, and 480, mounted to a planar substrate 472 and arranged such that they form a rectangular-shaped opening between them. A rectangular flip-chip die 482, larger than the opening, is disposed overlying and spanning the opening between dies 474, 476, 478, and 480. Die-to-die connections between die 482 and dies 474, 476, 478, and 480, and die-to-substrate connections between substrate 472 and dies 474, 476, 478, and 480, are formed as discussed hereinabove with respect to FIG. 4a.

Figure 5A:
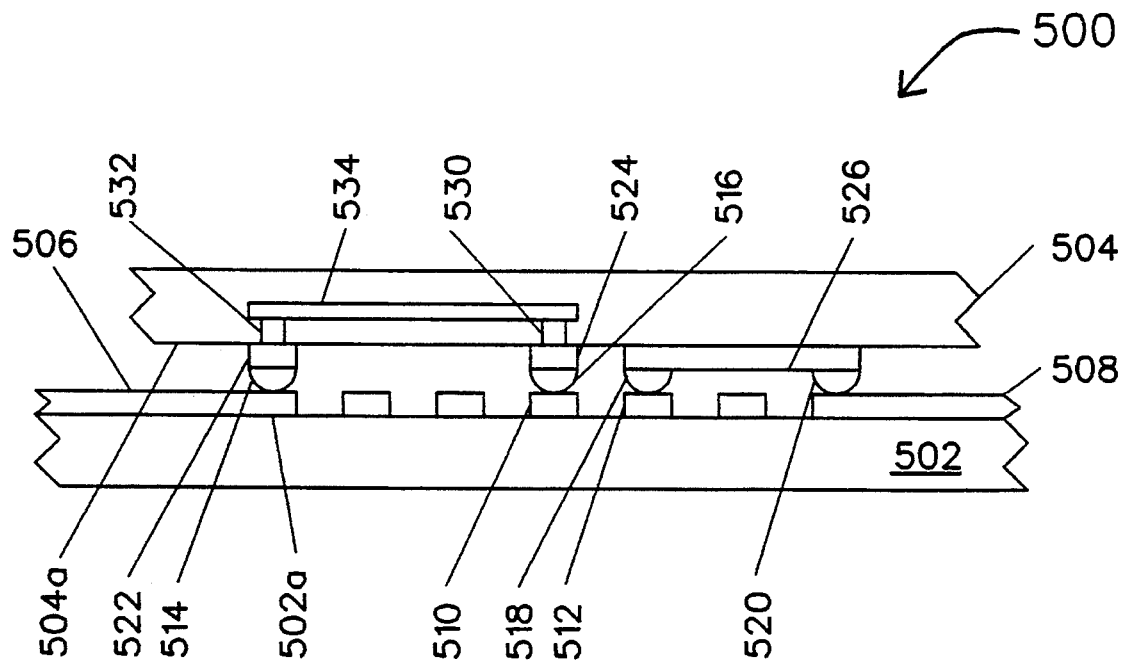
FIGS. 5a and 5b are side and top views, respectively, of an application of flip-chip jumpering, according to the present invention.
Figure 5B:
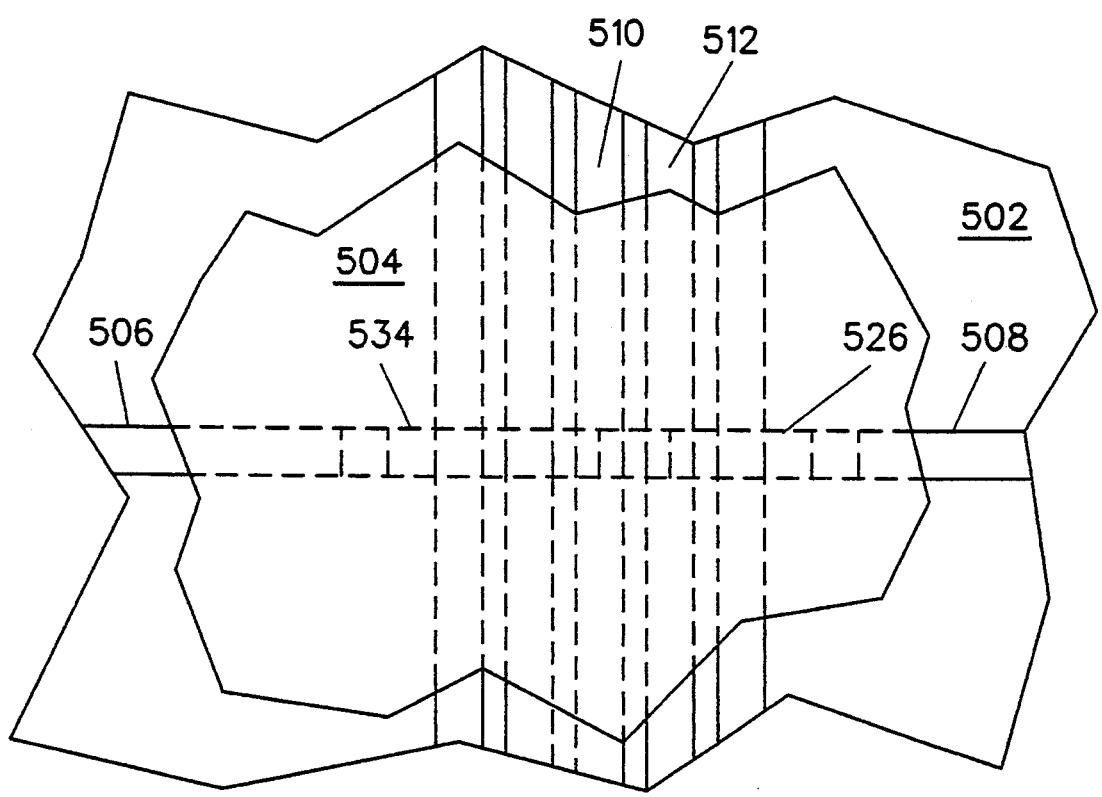

FIGS. 5a and 5b illustrate the application of another aspect of the present invention: jumpered contacts.

FIG. 5a is a cross-sectional view of a flip-chip assembly 500 making use of jumpered contacts to facilitate signal routing on a substrate 502. FIG. 5b is a top view of the same assembly. Substrate 502 has a number of conductive traces disposed on its top surface 502a, including conductive traces 506, 508, 510 and 512, as indicated. First conductive traces 506 and 508 run perpendicular to and on opposite sides of a number of parallel second conductive traces, among which are second conductive traces 510 and 512. In the application shown, first conductive trace 506 is to be connected to second conductive trace 510, but no short routing path along the surface 502a of substrate 502 is available. Similarly, first conductive trace 508 is to be connected to second conductive trace 512, but again, no short routing path along the surface 502a of substrate 502 is available. A flip-chip die 504 formed according to the invention, incorporates jumpered contacts on its bottom surface 504a. A solder bump contact 514 is positioned to align with first conductor 506 and another solder bump contact 516 is positioned to align with second conductor 510. A buried jumper configuration comprising conductive pads 522 and 524, conductive vias (plugs) 530 and 532, and internal conductor 534 bridges the gap between solder bump contacts 514 and 516, and forms the electrically conductive path therebetween. Another solder bump contact 518 is positioned to align with first conductor 508 and another solder bump contact 520 is positioned to align with second conductor 512. A surface jumper 526 bridges the gap between solder bump contacts 518 and 520, and forms the electrically conductive path therebetween. When the solder bump contacts are re-flowed, permanent jumpered connections are formed. In this manner, relatively short jumpered paths between conductive traces on a substrate may be formed, simplifying the layout of the substrate.

As described before, the face-to-face orientation of prior-art flip-chip assemblies can cause problems with local heating.

Another embodiment of the present invention involves combining chip-on-board technology with flip-chip technology in a "brickwork" configuration. In a "brickwork" assembly, a flip-chip die is flipped across two other dies, not necessarily the same as the flip-chip die, spanning the gap therebetween, with minimal overlap of the dies (in contrast to the IBM technique described, whereby identical dies are flipped on top of one another in an offset configuration to bridge a relatively small gap, with substantial overlap of the flipped dies). This configuration provides the connectivity benefits of flip-chip assemblies without the face-to-face orientation of heat-generating circuitry, thus helping to reduce the local heating problems of flip-chip arrangements.

Figure 1A:
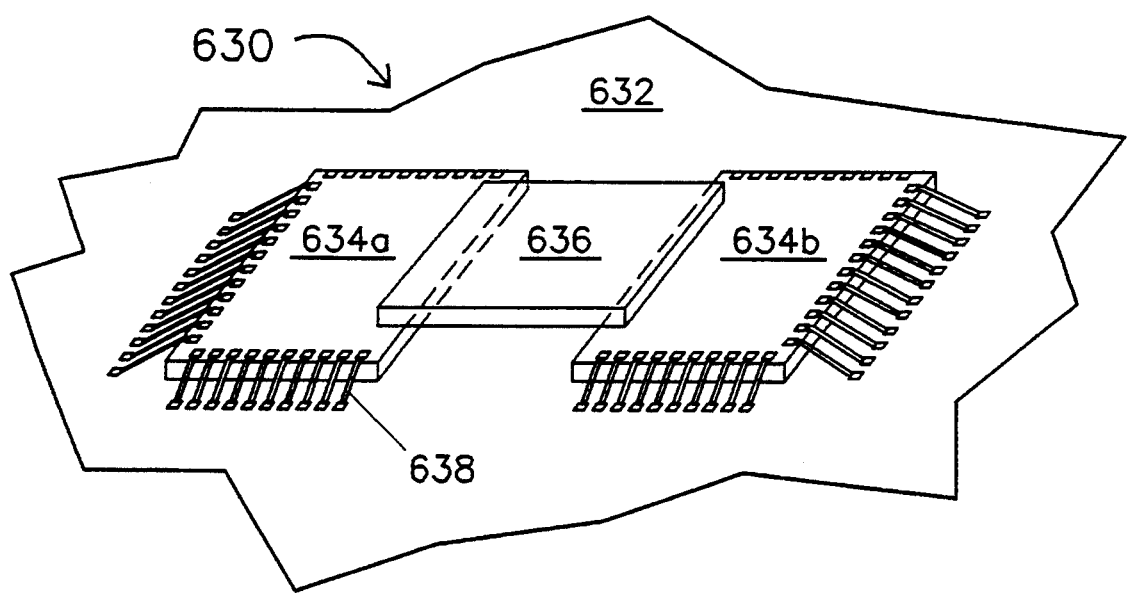
FIGS. 1a and 1b are perspective and cross-sectional (side) views of a "brickwork" assembly, using only single-sided flip-chip dies, according to the present invention.
Figure 1B:
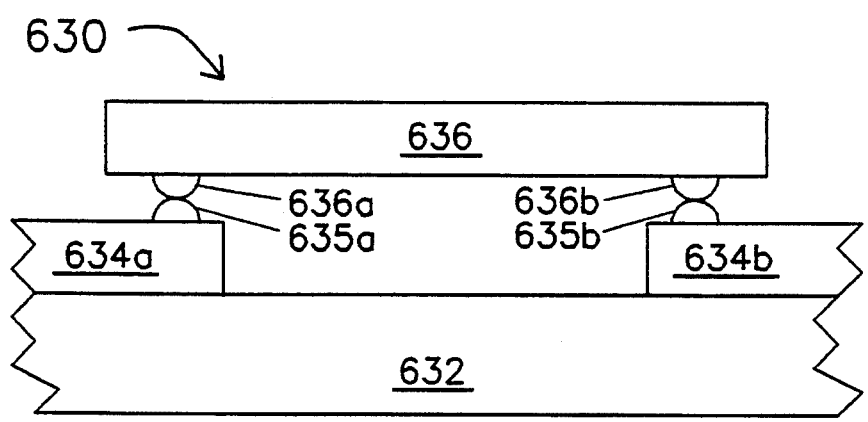

FIGS. 1a and 1b show such an assembly 630, which combines chip-on-board technology and flip chip technology into a "brickwork" assembly. In the configuration shown, FIG. 1a shows two integrated circuit dies 634a and 634b mounted to a substrate 632 and wire bonded with bond wires 638 to conductive traces on the substrate (not shown, to reduce illustrative clutter). Dies 634a and 634b are spaced closely enough that a third "flip-chip" die 636 may span the gap between them. Two sets of contact areas on the underside (circuit side) of die 636 mate with and connect to matching contact areas on dies 634a and 634b. FIG. 1b is a cross-sectional view of a portion of the assembly 630 showing bump contact areas 636a and 636b on the underside (circuit side) of die 636 and mating contact areas 635a and 635b on dies 634a and 634b, respectively. Although this assembly 630 does make use of bond wires 638 for connection to conductive traces on the substrate, it has the advantage that conventional, single-sided flip-chip dies may be used for all of the dies in the assembly. Notably, the face-to-face overlap between the die 636 and either of the dies 634a or 634b is preferably limited to just enough to make contact between the dies. In this manner, overlap of the active circuit elements occupying a substantial central portion of the respective dies is substantially avoided, and heat can be efficiently dissipated from the individual dies.

It should be understood that while the applications of the present invention discussed hereinabove have discussed the use of solder bump contacts, any suitable bumped (raised) contact means may be used.

Figure 6:
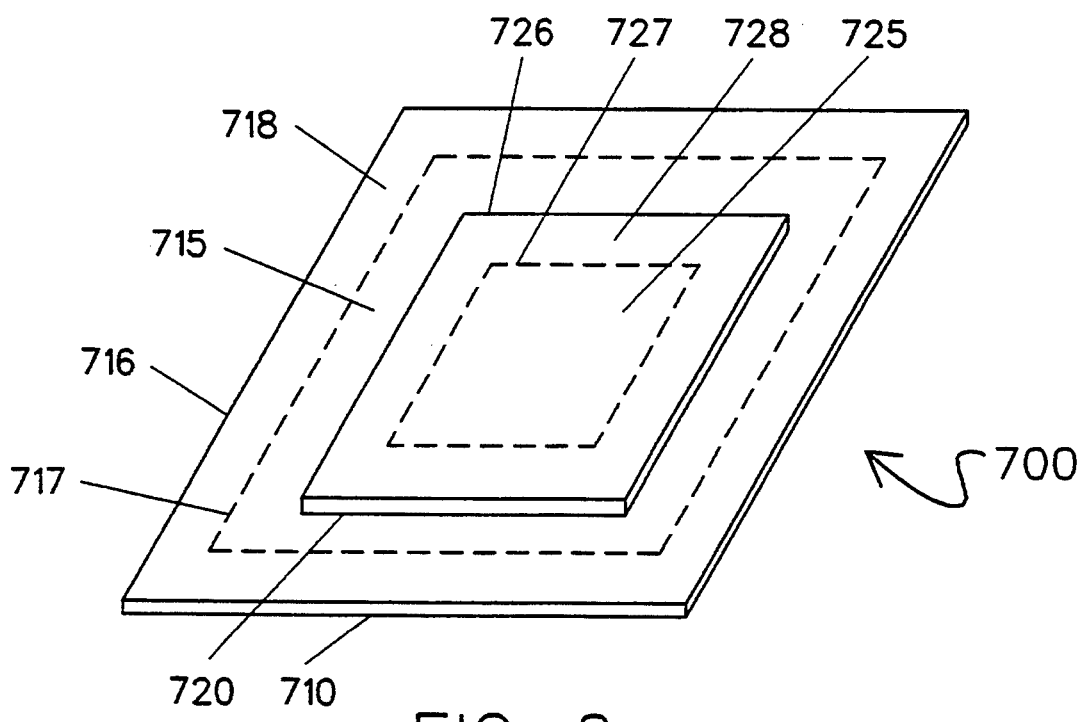
FIG. 6 is a view of a two tier flip-chip die assembly used to increase the amount of I/O area available (bond pad density) within a given die footprint.

FIG. 6 illustrates a two-tier flip-chip assembly 700 used to increase the bond pad density (by increasing the amount of "aggregate" die periphery available) for a given footprint (area of the assembly as seen in plan view). A semiconductor die 720 is flip-chip mounted to another semiconductor die 710. This involves bond sites around the periphery of the bottom of the die 720, and bond sites in a corresponding (central) area of the die 710. The techniques discussed hereinabove are suitably employed to make the die-to-die connections.

A peripheral area 718 is defined along (within) the edges 716 (one indicated) of the die 710 between the edges 716 and a dashed line 717 representing a boundary between the peripheral area 718 and an active element area 715. The peripheral area 718 is limited by its size to holding only a limited first number "n" of bond pads (for I/O connections to the die 710). Another peripheral area 728 is defined along edges 726 (one indicated) of the die 720 between the edges 726 and a dashed line 727 representing a boundary between the peripheral area 728 and an active element area 725. The peripheral area 728 is similarly limited by its size to holding only a limited second number "m" of bond pads (for I/O connections to the die 720).

The "footprint" area of the assembly 700 of dies 710, 720 is defined as the plan area of the larger die 710. In this example, the die 710 is a square die, having side edges measuring one unit. Hence, the footprint area for the assembly 700 is one unit$^2$. The periphery to area ratio for a square shape is 4:1. Hence, the square die 710 has 4 units of peripheral area available for I/O.

Similarly, the die 720 is a square die, having a 4:1 ratio of periphery (peripheral area) to overall area.

If, for example the semiconductor dies 710 and 720 are both square, and the edges 726 of die 720 are one-half the length of the edges 716 of die 710, then the periphery to footprint area ratio for the assembly 700 is, in aggregate 6:1, which represents a 50% improvement over the periphery:area ratio for the die 710.

If this same periphery:area ratio were to be implemented with, for example, a single greatly elongated rectangle shaped die, the aspect ratio (length to width ratio) for the greatly elongated rectangle would have to be nearly 7:1.

In another example, if the edges 726 of die 720 are three fourths as long as the edges 716 of die 710, then the periphery to footprint area ratio for the assembly is 7:1, without exceeding the footprint of die 710.

If this same periphery:area ratio were to be implemented with, for example, a single greatly elongated rectangle shaped die, the aspect ratio for the greatly elongated rectangle would have to be over 10:1.

In the two examples given above, the extreme aspect ratios of a greatly elongated rectangular die (7:1 or 10:1) having comparable periphery:area (i.e., increased I/O for a given footprint) would preclude the use of standard packaging techniques. In contrast thereto, the flip-chip arrangement of FIG. 6 provides a significant increase in the amount of I/O (peripheral area) on the assembly while simultaneously providing greater circuit area within the footprint of the die 710.

Since bond pads for making external connections to a semiconductor die or die assembly are generally disposed along the die edges, an increase in die periphery to footprint area ratio signals an increase in potential bond pad density, since more space is available for bond pads. In other words, using standard bonding techniques (bond pad size and spacing), implementing greatly increased I/O, in absolute terms, can be achieved. For example, I/O counts on the order of in excess of six hundred (e.g., >600, 650, >700, >800, >900, >1000 (can readily be achieved using "standard" die sizes (on the order of a few centimeters) and "standard" packages. Evidently, m+n bond pads (I/O) is readily achieved in the example of FIG. 6.

The technique described hereinabove provides for dramatic increases in the I/O (periphery) available within a given assembly footprint, providing periphery to footprint area ratios of greater than "x":1, where "x" is, for example, 5.0, 5.25, 5.5, 5.75, 6.0, 6.25, 6.5, 6.75, or 7.0. An upper bound for the periphery to area ratio expansion provided by this technique is twice the periphery to area ratio of the footprint, although this is only achieved by using two dies of the same size, which would make connection to the bottom-most die extremely cumbersome or impossible. Other die shapes may be used, such as, rectangles, triangles, trapezoids, parallelograms, etc., with similar increases in periphery to footprint area ratio. Multi-tier flip-chip assemblies may also be used to further increase the periphery to footprint area ratio (i.e., in excess of twice that of the largest die).

While the foregoing discussion with respect to FIG. 6 has been directed generally toward a single die (e.g., 720) atop another die (e.g., 710), it will be appreciated by one of ordinary skill in the art that more than one die can be "flipped" onto another die, yielding similar increases in die periphery to footprint area ratio.

Double-sided flip-chip dies, such as those discussed hereinabove, are particularly useful in configurations such as that shown in FIG. 6 for permitting interconnections between the upward-facing side of the bottom die (e.g., 710) and the downward-facing side of the top die (e.g., 720), while still permitting bond pads (I/O) to be disposed along the periphery of the upward-facing side of the top-die. Examples of such configurations are shown in FIGS. 7a and 7b.

Figure 7A:
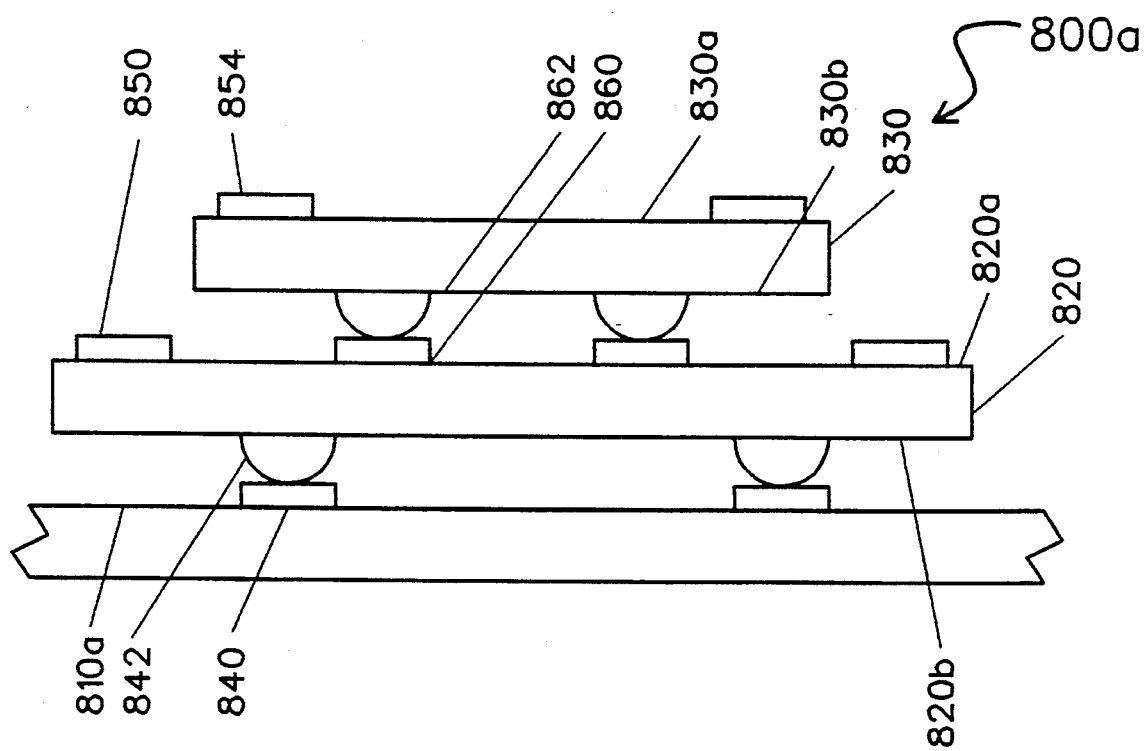
FIGS. 7a and 7b are side views of two-tier flip-chip die assemblies used to increase bond pad density within a given die footprint.

FIG. 7a is a side view of a stacked flip-chip die assembly 800a using double-sided flip-chip dies which increases the number of bond pads (die periphery area) available within a given footprint. A first double-sided flip-chip die 820 is mounted to conductive pads 840 on a substrate 810a via solder bump contacts 842 on a downward facing (as viewed in the Figure) surface 820b of the die 820. Bond pads 850, for external connections, are disposed on an upward facing (as shown) surface 820a of the die 820 along the edges (periphery) thereof. A second double sided flip-chip die 830 is mounted to bond pads 860 disposed on the top surface 820a of the first die 820 via bump contacts 862 disposed on a downward facing surface of the second die 830. An upward facing surface of the second die 820 has bond pads 854, for external connections, disposed along the edges (periphery) thereof. The substrate 810a is typically part of a semiconductor package, but can also be a printed circuit board.

Figure 7B:
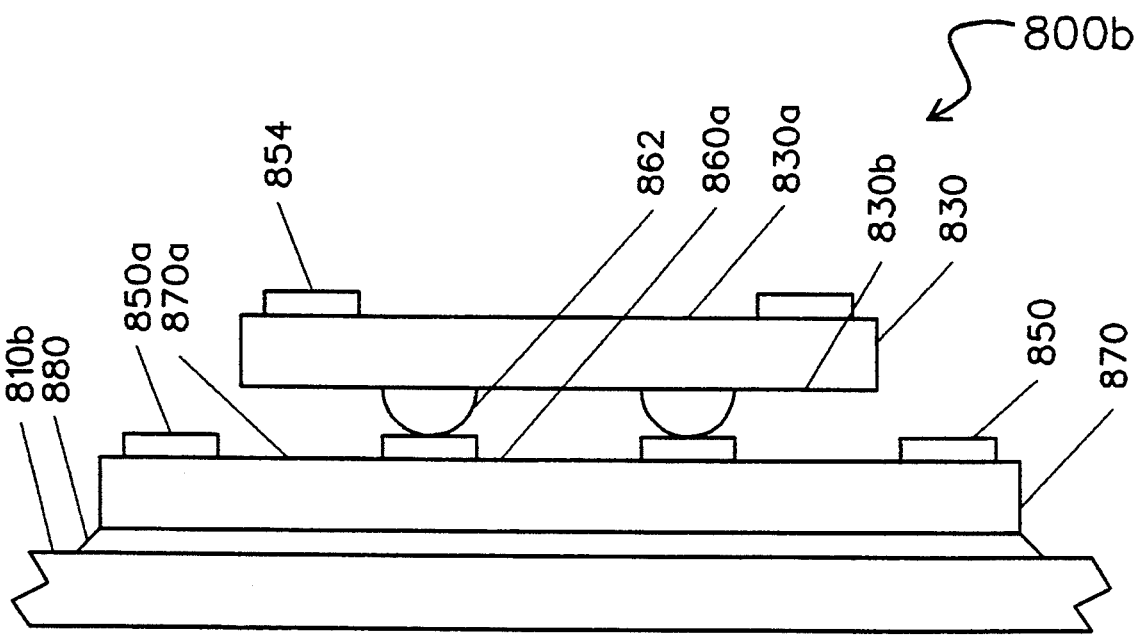

FIG. 7b is a side view of another stacked flip-chip die assembly 800b which increases the number of bond pads (die periphery area) available within a given footprint, using the same second die 830 as shown with respect to FIG. 7a. A first die 870 is bonded with an adhesive 880 to a substrate 810b. An upward facing side 870a of the substrate has bond pads 850a disposed along the edges thereof, for the purpose of making external connections to the die 870. The die 830 is mounted to second bond pads 860a disposed on the upward facing surface 870a of the first die 870 via bump contacts 862 disposed on the downward facing surface 830b of the second die 830. As in FIG. 7a, bond pads 854, disposed on the top surface 830a of the second die 830, are also available for external connections.

While FIGS. 7a and 7b show a single die disposed atop another (i.e., die-on-die), it is within the scope of the present invention to dispose more than one die atop another (i.e., dies-on die), providing similar increases in bond pad density for a given footprint area.

Potential applications for assemblies such as those discussed hereinabove with respect to FIGS. 6, 7a and 7b include flip-chip mounting of logic chips (dies) to a large memory die, and providing additional external connections via the flip-chip mounted logic chips (dies). For example, one or more logic dies can be flipped onto the surface of a rectangular memory die.

What is claimed is:

1. A double-sided semiconductor die, comprising:
    a single-layer semiconductor die having a first surface and a second surface opposite the first surface;
    circuit elements formed within the first surface;
    a first plurality of raised bump contacts disposed on the first surface, and connected to the circuit elements;
    a second plurality of raised bump contacts disposed on the second surface, at least a one portion of the second plurality of raised bump contacts connected through the die to the circuit elements on the first surface of the die; and
    conductive vias connecting at least one of the first plurality of raised bump contacts to at least one of the second plurality of raised bump contacts, said conductive vias consisting of conductive cores surrounded by insulation and disposed through holes formed in the die from the first surface to the second surface.

2. A double-sided semiconductor die according to claim 1, further comprising:
    conductive jumpers forming electrical connections between some of the first or second bump contacts.

3. A double-sided semiconductor die according to claim 2, wherein:
    at least one conductive jumper is disposed on an insulating layer disposed on a surface of the die.

4. A flip-chip die assembly with increased bond pad density within a given footprint area, comprising:
    a first semiconductor die having a first surface, a peripheral area of the first surface, and a second surface opposite the first surface;
    first bond pads disposed in the peripheral area of the first surface;
    at least one second semiconductor die having a top surface, a bottom surface, and a peripheral area of the top surface, said at least one second semiconductor die being smaller than said first semiconductor die and mounted by its bottom surface to the first surface of the first semiconductor die, whereby the first bond pads remain exposed; and
    second bond pads disposed on the top surface of the at least one second semiconductor die along the peripheral area thereof,
    wherein the first and second bond pads provide for making external connections to the first and at least one second semiconductor dies, respectively.

5. A flip-chip die assembly with increased bond pad density within a given footprint area according to claim 4, further comprising:
    a substrate;
    wherein:
    the second surface of the first semiconductor die is mounted to the substrate.

6. A flip-chip die assembly with increased bond pad density within a given footprint area according to claim 5, wherein:
    the first semiconductor die is a double-sided flip-chip die;
    the substrate has conductive pads disposed on a mounting surface thereof; and
    the first semiconductor die is mounted to the conductive pads on the substrate.

7. A flip-chip die assembly with increased bond pad density within a given footprint area according to claim 4, wherein:
    the second semiconductor die is a double-sided flip-chip die.

8. A flip-chip die assembly with increased bond pad density within a given footprint area according to claim 4, wherein:
    a ratio of aggregate peripheral area to footprint area is achieved which is in excess of 5:1.

* * * * *